(12) United States Patent
Murai et al.

(10) Patent No.: US 10,964,622 B2
(45) Date of Patent: Mar. 30, 2021

(54) SEMICONDUCTOR PACKAGE

(71) Applicant: Mitsubishi Electric Corporation, Tokyo (JP)

(72) Inventors: Ryoji Murai, Fukuoka (JP); Natsuki Tsuji, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/481,364

(22) PCT Filed: May 24, 2017

(86) PCT No.: PCT/JP2017/019397
§ 371 (c)(1),
(2) Date: Jul. 26, 2019

(87) PCT Pub. No.: WO2018/216146
PCT Pub. Date: Nov. 29, 2018

(65) Prior Publication Data
US 2020/0083141 A1   Mar. 12, 2020

(51) Int. Cl.
*H01L 23/40* (2006.01)
*H01L 23/31* (2006.01)
(Continued)

(52) U.S. Cl.
CPC ...... *H01L 23/4006* (2013.01); *H01L 23/3121* (2013.01); *H01L 23/3672* (2013.01); *H01L 23/473* (2013.01)

(58) Field of Classification Search
CPC ............ H01L 23/4006; H01L 23/3121; H01L 23/3672; H01L 23/473
See application file for complete search history.

(56) References Cited

U.S. PATENT DOCUMENTS

2013/0062750 A1* 3/2013 Lenniger ................. H01L 24/40
257/691
2014/0367842 A1* 12/2014 Miyamoto ............ H01L 23/473
257/693

(Continued)

FOREIGN PATENT DOCUMENTS

JP    2008-016515 A    1/2008

OTHER PUBLICATIONS

International Search Report; Written Opinion; and Notification of Transmittal of the International Search Report and the Written Opinion of the International Searching Authority, or the Declaration issued in PCT/JP2017/019397; dated Jun. 20, 2017.

*Primary Examiner* — Fernando L Toledo
*Assistant Examiner* — Valerie N Newton
(74) *Attorney, Agent, or Firm* — Studebaker & Brackett PC

(57) ABSTRACT

A cooler (1) has a cooling plate (1a), a cooling fin (1b) provided on a center portion of a lower surface of the cooling plate (1a), and a lower projection (1c) provided on a peripheral portion of the lower surface of the cooling plate (1a). A semiconductor device (3) is provided on an upper surface of the cooling plate (1a). A bus bar (5) is connected to the semiconductor device (3). A cooling mechanism (8) encloses a lower surface and a lateral surface of the cooler (1). An O-ring (9) is provided between a lower surface of the lower projection (1c) and a bottom surface of the cooling mechanism (8). A bolt (10) penetrates a sidewall of the cooling mechanism (8) and screws the cooler (1) to the cooling mechanism (8).

11 Claims, 5 Drawing Sheets

(51) Int. Cl.
*H01L 23/367* (2006.01)
*H01L 23/473* (2006.01)

(56) References Cited

U.S. PATENT DOCUMENTS

| | | | |
|---|---|---|---|
| 2015/0097281 A1* | 4/2015 | Adachi | H01L 23/473 257/714 |
| 2016/0079155 A1* | 3/2016 | Kawase | H01L 23/3677 257/712 |
| 2016/0322278 A1* | 11/2016 | Sawagashira | H01L 23/4006 |
| 2017/0353003 A1* | 12/2017 | Murai | H01S 5/0261 |

* cited by examiner

SEMICONDUCTOR PACKAGE

FIELD

The present invention relates to a semiconductor package in which a cooler is screwed to a cooling mechanism.

BACKGROUND

In a semiconductor package, a semiconductor device is provided on the upper surface of a cooler via an insulating substrate. Heat generated from the semiconductor device is radiated through cooling fins provided on the lower surface of the cooler. Conventionally, an O-ring is provided between a cooling mechanism and the cooler, and the cooler is fixed to the cooling mechanism with bolts from the upper surface of the cooler. However, it is needed to secure insulation distances between the external connection part of a bus bar protruding from resin and the heads of the bolts, and hence, a package size has been problematically upsized. To solve this problem, there is proposed, for example, a structure in which the O-ring and the bolts are positioned on its lateral surface (for example, see PTL 1).

CITATION LIST

Patent Literature

[PTL 1] JP 2008-016515 A

SUMMARY

Technical Problem

However, when the cooler is to be fixed to the cooling mechanism in the state where the O-ring is provided on such a vertical lateral surface of the cooler, it is concerned that the O-ring slips off due to the gravity, which causes positional displacement of the O-ring. Moreover, it is required to manage the dimensions of components with high accuracy in order to enhance fitting performance for the cooling mechanism and the cooler. This has problematically caused difficulty in assembly.

The present invention is devised in order to solve the aforementioned problems, and an object thereof is to obtain a semiconductor package which enables its package size to be downsized and its assembly to be easy.

Solution to Problem

A semiconductor package according to the present invention includes: a cooler having a cooling plate, a cooling fin provided on a center portion of a lower surface of the cooling plate, and a lower projection provided on a peripheral portion of the lower surface of the cooling plate; a semiconductor device provided on an upper surface of the cooling plate; a bus bar connected to the semiconductor device; a cooling mechanism enclosing a lower surface and a lateral surface of the cooler; an O-ring provided between a lower surface of the lower projection and a bottom surface of the cooling mechanism; and a bolt penetrating a sidewall of the cooling mechanism and screwing the cooler to the cooling mechanism.

Advantageous Effects of Invention

In the present invention, the bolt penetrating the sidewall of the cooling mechanism screws the cooler to the cooling mechanism. Since there are accordingly no heads of the bolts on the upper surface, of the cooling plate, where the semiconductor device is provided, it is not needed to secure insulation distances between the external connection part of the bus bar and the bolt. Moreover, since the O-ring is provided between the lower surface of the lower projection provided on the peripheral portion of the lower surface of the cooling plate and the bottom surface of the cooling mechanism, positional displacement of the O-ring can be prevented. Therefore, the package size can be downsized, and assembly is easy.

DESCRIPTION OF EMBODIMENTS

A semiconductor package according to the embodiments of the present invention will be described with reference to the drawings. The same components will be denoted by the same symbols, and the repeated description thereof may be omitted.

Embodiment 1

Figure 1:
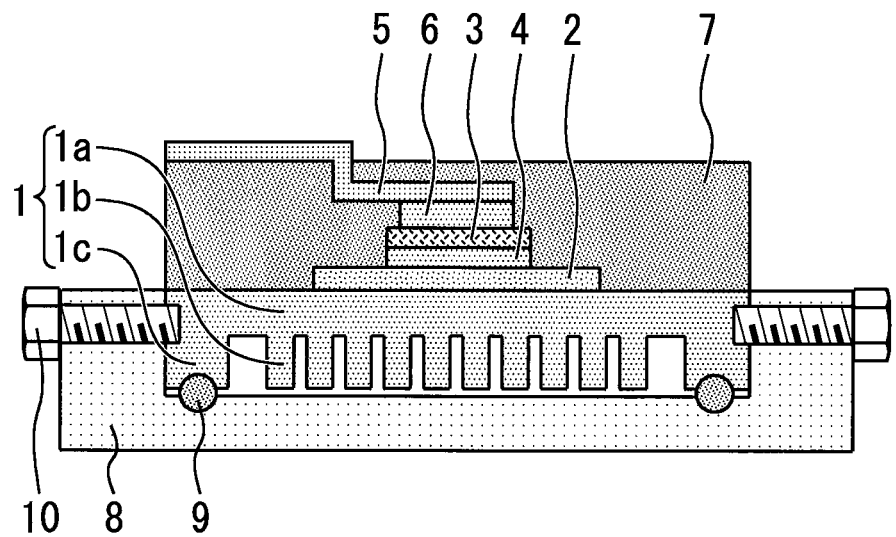
FIG. 1 is a cross-sectional view illustrating a semiconductor package according to Embodiment 1 of the present invention.

FIG. 1 is a cross-sectional view illustrating a semiconductor package according to Embodiment 1 of the present invention. A cooler 1 has a cooling plate 1a, cooling fins 1b provided on the center portion of the lower surface of the cooling plate 1a, and a lower projection 1c provided on the peripheral portion of the lower surface of the cooling plate 1a.

An insulating substrate 2 is provided on the upper surface of the cooling plate 1a. A semiconductor device 3 is connected to the upper surface of the insulating substrate 2 via a solder 4. A bus bar 5 is connected to the upper surface of the semiconductor device 3 via a solder 6. Insulative resin 7 covers the insulating substrate 2, the semiconductor device 3 and a part of the bus bar 5.

A cooling mechanism 8 encloses the lower surface and the lateral surface of the cooler 1. An O-ring 9 is provided between the lower surface of the lower projection 1c and the bottom surface of the cooling mechanism 8. Bolts 10 penetrate the sidewall of the cooling mechanism 8, are screwed through the lateral surface of the cooler 1, and thereby, screw the cooler 1 to the cooling mechanism 8.

Figure 2:
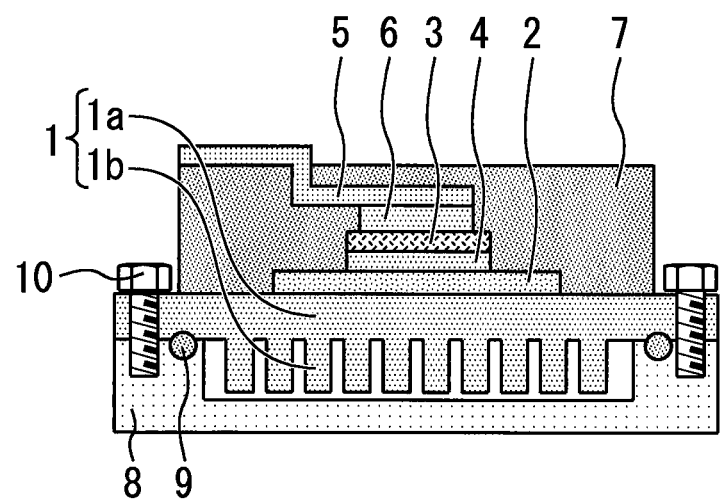
FIG. 2 is a cross-sectional view illustrating a semiconductor package according to the comparative example.

Subsequently, effects of the present embodiment are described in comparison with a comparative example. FIG. 2 is a cross-sectional view illustrating a semiconductor package according to the comparative example. In the comparative example, the cooler 1 is fixed to the cooling mechanism 8 with bolts from the upper surface of the cooler 1. However, it is needed to secure insulation distances between the external connection part of the bus bar 5 protruding from the resin 7 and the heads of the bolts 10, and hence, a package size is problematically upsized.

On the contrary, in the present embodiment, the bolts 10 penetrating the sidewall of the cooling mechanism 8 screw the cooler 1 to the cooling mechanism 8. Since there are accordingly no heads of the bolts 10 on the upper surface, of the cooling plate 1a, where the semiconductor device 3 is provided, it is not needed to secure insulation distances between the external connection part of the bus bar 5 and the bolts 10. Moreover, since the O-ring 9 is provided between the lower surface of the lower projection 1c provided on the peripheral portion of the lower surface of the cooling plate 1a and the horizontal bottom surface of the cooling mechanism 8, positional displacement of the O-ring 9 can be prevented. Therefore, the package size can be downsized, and assembly is easy.

Embodiment 2

Figure 3:
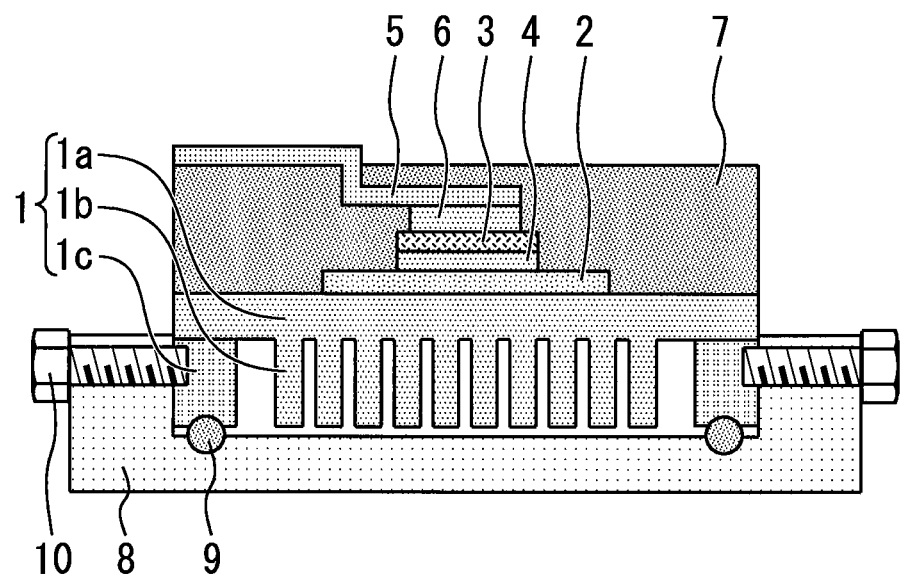
FIG. 3 is a cross-sectional view illustrating a semiconductor package according to Embodiment 2 of the present invention.

FIG. 3 is a cross-sectional view illustrating a semiconductor package according to Embodiment 2 of the present invention. The lower projection 1c is composed of a hard metal which is joined onto the lower surface of the cooling plate 1a and is harder than the cooling plate 1a. The bolts 10 are screwed into the lower projection 1c. Thereby, proof pressure of tightening is made large, and fastening force with the bolts 10 can be improved. Furthermore, since rigidity of the cooler 1 is improved, the cooler 1 can be suppressed from warping. Moreover, thread grooves in the cooler 1 are not needed. The other components and effects are similar to those in Embodiment 1.

Embodiment 3

Figure 4:
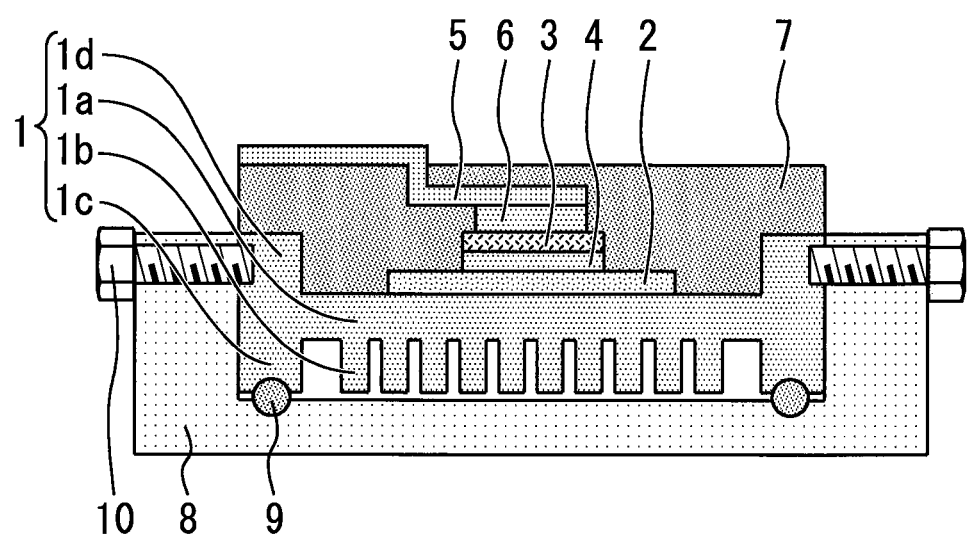
FIG. 4 is a cross-sectional view illustrating a semiconductor package according to Embodiment 3 of the present invention.

FIG. 4 is a cross-sectional view illustrating a semiconductor package according to Embodiment 3 of the present invention. The cooler 1 further has an upper projection 1d provided on the peripheral portion of the upper surface of the cooling plate 1a. Since the upper projection 1d is covered by the resin 7, it is not needed to secure an insulation distance between the upper projection 1d and the bus bar 5. Since rigidity of the cooler 1 is improved by the upper projection 1d, the cooler 1 can be suppressed from warping. The other components and effects are similar to those in Embodiment 1.

Embodiment 4

Figure 5:
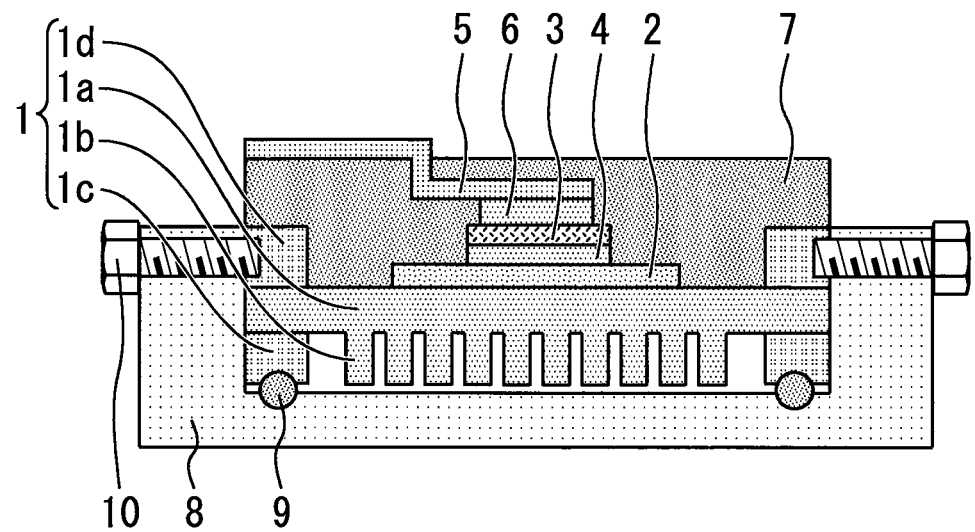
FIG. 5 is a cross-sectional view illustrating a semiconductor package according to Embodiment 4 of the present invention.

FIG. 5 is a cross-sectional view illustrating a semiconductor package according to Embodiment 4 of the present invention. The upper projection 1d is composed of a hard metal which is joined to the upper surface of the cooling plate 1a and is harder than the cooling plate 1a, and the bolts 10 are screwed into the upper projection 1d. Thereby, proof pressure of tightening is made large, and fastening force with the bolts 10 can be improved. The other components and effects are similar to those in Embodiment 3.

Embodiment 5

Figure 6:
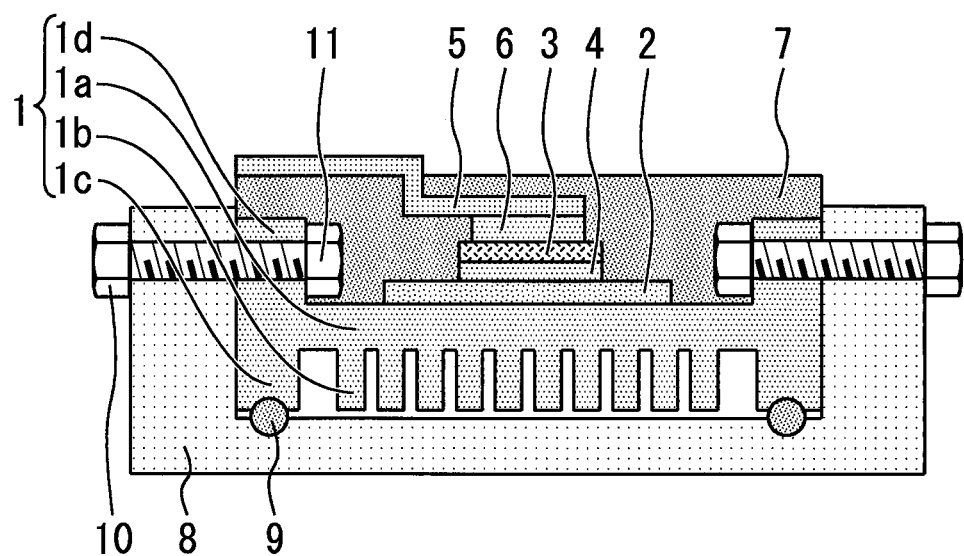
FIG. 6 is a cross-sectional view illustrating a semiconductor package according to Embodiment 5 of the present invention.

FIG. 6 is a cross-sectional view illustrating a semiconductor package according to Embodiment 5 of the present invention. The bolts 10 penetrate the upper projection 1d, and nuts 11 having screw holes are attached to the tips of the bolts 10. The nuts 11 are composed of a hard metal harder than the cooler 1. Such fixation with the bolts 10 and the nuts 11 can eliminate thread grooves from the cooler 1, and fastening force with the bolts 10 can be improved. The other components and effects are similar to those in Embodiment 3.

Embodiment 6

Figure 7:
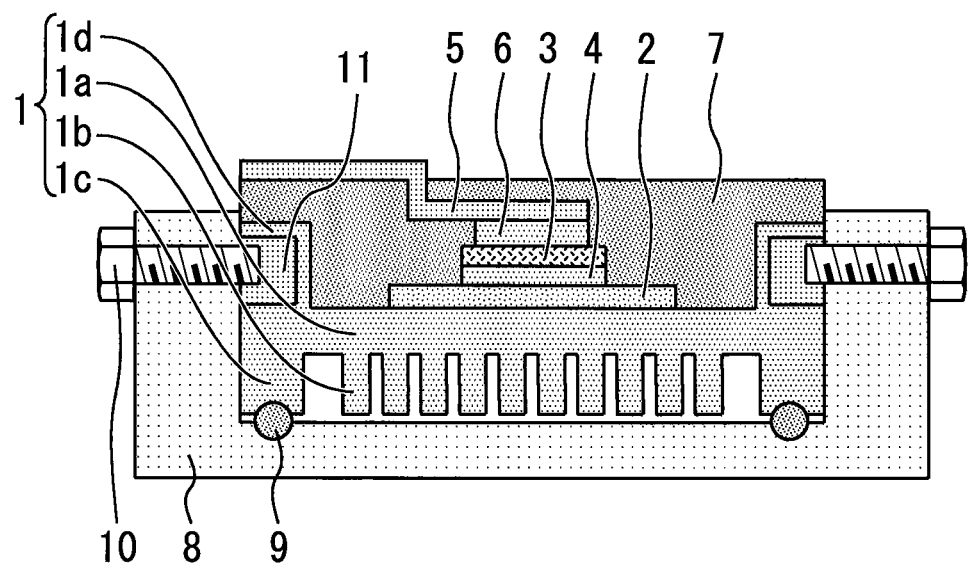
FIG. 7 is a cross-sectional view illustrating a semiconductor package according to Embodiment 6 of the present invention.

FIG. 7 is a cross-sectional view illustrating a semiconductor package according to Embodiment 6 of the present invention. The nuts 11 are embedded through the lateral surface of the upper projection 1d. The bolts 10 are screwed into the nuts 11. Such fixation with the bolts 10 and the nuts 11 can eliminate thread grooves from the cooler 1, and fastening force with the bolts 10 can be improved. The other components and effects are similar to those in Embodiment 3.

Embodiment 7

Figure 8:
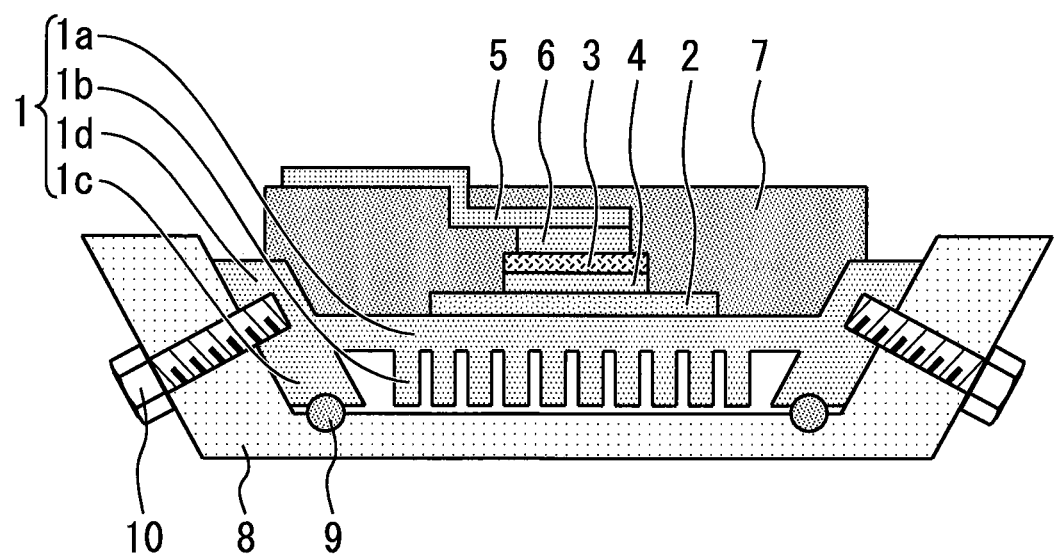
FIG. 8 is a cross-sectional view illustrating a semiconductor package according to Embodiment 7 of the present invention.

FIG. 8 is a cross-sectional view illustrating a semiconductor package according to Embodiment 7 of the present invention. The sidewall of the cooling mechanism 8 is inclined so as to spread upward from the bottom surface of the cooling mechanism 8. The lateral surface of the cooler 1 is inclined so as to face the inner lateral surface of the sidewall of the cooling mechanism 8. The bolts 10 are perpendicularly fastened with respect to the sidewall of the cooling mechanism 8 and the lateral surface of the cooler 1, which are inclined, and thereby, force downward for crushing the O-ring 9 is generated, which improves a sealing effect. The other components and effects are similar to those in Embodiment 3.

Embodiment 8

Figure 9:
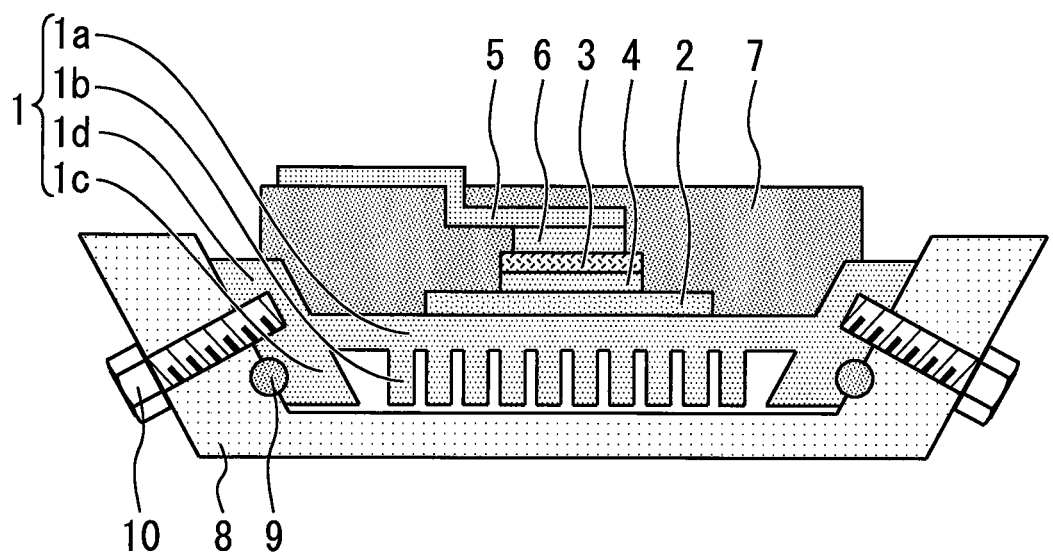
FIG. 9 is a cross-sectional view illustrating a semiconductor package according to Embodiment 8 of the present invention.

FIG. 9 is a cross-sectional view illustrating a semiconductor package according to Embodiment 8 of the present invention. The O-ring 9 is provided between the lateral surface of the lower projection 1c and the inner lateral surface of the sidewall of the cooling mechanism 8. Since the inner lateral surface of the sidewall of the cooling mechanism 8 and the lateral surface of the cooler 1 are inclined, positional displacement of the O-ring 9 can be prevented when the O-ring 9 is provided between both. Furthermore, since force in the direction for crushing the O-ring 9 is generated by fastening the bolts 10, a sealing effect is improved. The other components and effects are similar to those in Embodiment 7.

Embodiment 9

Figure 10:
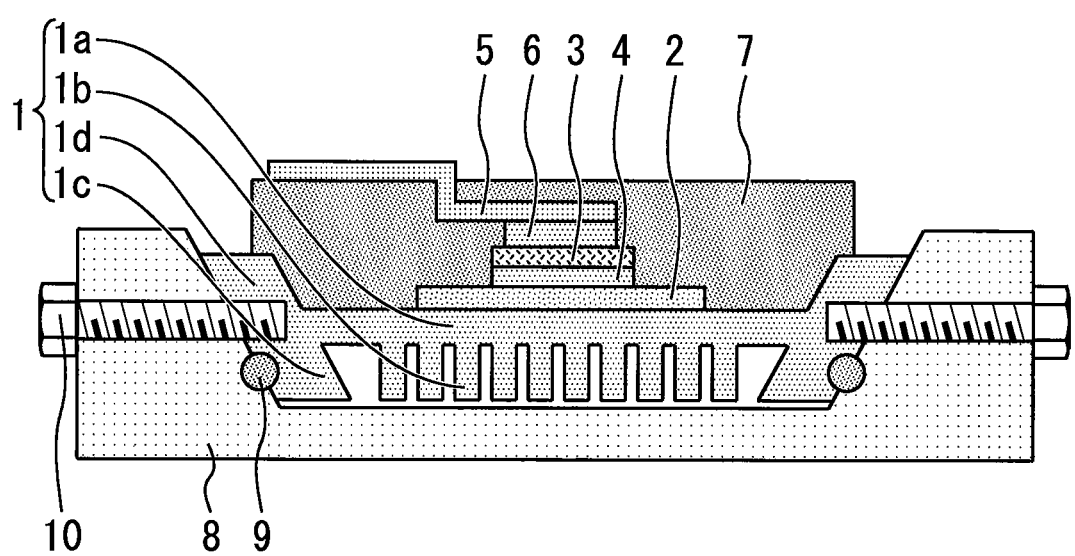
FIG. 10 is a cross-sectional view illustrating a semiconductor package according to Embodiment 9 of the present invention.

FIG. 10 is a cross-sectional view illustrating a semiconductor package according to Embodiment 9 of the present invention. The outer lateral surface of the cooling mechanism 8 is perpendicular to the bottom surface of the cooling mechanism 8. Thereby, since the direction for fastening the bolts 10 is the horizontal direction, assembly performance in fastening the bolts 10 is improved. The other components and effects are similar to those in Embodiment 8.

The semiconductor device 3 is a MOSFET, an SBD, an IGBT, a PN diode or the like. The semiconductor device 3 is not limited to a semiconductor device formed of silicon, but instead may be formed of a wide-bandgap semiconductor having a bandgap wider than that of silicon. The wide-bandgap semiconductor is, for example, a silicon carbide, a gallium-nitride-based material, or diamond. A power semiconductor device formed of such a wide-bandgap semiconductor has a high voltage resistance and a high allowable current density, and thus can be miniaturized. The use of such a miniaturized semiconductor device enables the miniaturization of the semiconductor package in which the semiconductor device is incorporated. Further, since the semiconductor device has a high heat resistance, a radiation fin of a heatsink can be miniaturized and a water-cooled part can be air-cooled, which leads to further miniaturization of the semiconductor package. Further, since the semiconductor device has a low power loss and a high efficiency, a highly efficient semiconductor package can be achieved.

REFERENCE SIGNS LIST

1 cooler; 1a cooling plate; 1b cooling fin; 1c lower projection; 1d upper projection; 3 semiconductor device; 5 bus bar; 8 cooling mechanism; 9 O-ring; 10 bolt; 11 nut

The invention claimed is:

1. A semiconductor package comprising:
a cooler having a cooling plate, a cooling fin provided on a center portion of a lower surface of the cooling plate, and a lower projection provided on a peripheral portion of the lower surface of the cooling plate;
a semiconductor device provided on an upper surface of the cooling plate;
a bus bar connected to the semiconductor device;
a cooling mechanism enclosing a lower surface and a lateral surface of the cooler;
an O-ring provided between a lower surface of the lower projection and a bottom surface of the cooling mechanism; and
a bolt penetrating a sidewall of the cooling mechanism and screwing the cooler to the cooling mechanism.

2. The semiconductor package according to claim 1, wherein the cooler has an upper projection provided on a peripheral portion of the upper surface of the cooling plate, and resin covering the semiconductor device and the upper projection.

3. The semiconductor package according to claim 2, wherein the upper projection is composed of a hard metal harder than the cooling plate, and the bolt is screwed into the upper projection.

4. The semiconductor package according to claim 2, wherein the bolt penetrates the upper projection, and a nut is attached to a tip of the bolt.

5. The semiconductor package according to claim 2, wherein a nut having a screw hole is embedded through a lateral surface of the upper projection, and the bolt is screwed into the nut.

6. The semiconductor package according to claim 1, wherein the lower projection is composed of a hard metal harder than the cooling plate, and the bolt is screwed into the lower projection.

7. The semiconductor package according to claim 1, wherein the sidewall is inclined so as to spread upward from the bottom surface of the cooling mechanism, and
the lateral surface of the cooler is inclined so as to face an inner lateral surface of the sidewall.

8. The semiconductor package according to claim 1, wherein the semiconductor device is made of a wide-bandgap semiconductor.

9. A semiconductor package comprising:
a cooler having a cooling plate, a cooling fin provided on a center portion of a lower surface of the cooling plate, and a lower projection provided on a peripheral portion of the lower surface of the cooling plate;
a semiconductor device provided on an upper surface of the cooling plate;
a bus bar connected to the semiconductor device;
a cooling mechanism enclosing a lower surface and a lateral surface of the cooler;
an O-ring between a lateral surface of the lower projection and an inner lateral surface of a sidewall of the cooling mechanism; and
a bolt penetrating the sidewall and screwing the cooler to the cooling mechanism,
wherein the inner lateral surface of the sidewall is inclined so as to spread upward from a bottom surface of the cooling mechanism, and
the lateral surface of the cooler is inclined so as to face the inner lateral surface of the sidewall.

10. The semiconductor package according to claim 9, wherein an outer lateral surface of the sidewall is perpendicular to the bottom surface of the cooling mechanism.

11. The semiconductor package according to claim 9, wherein the semiconductor device is made of a wide-bandgap semiconductor.

* * * * *